(12) United States Patent
Jiang et al.

(10) Patent No.: US 7,821,187 B1
(45) Date of Patent: Oct. 26, 2010

(54) IMMERSION GUN EQUIPPED ELECTRON BEAM COLUMN

(75) Inventors: Xinrong Jiang, Palo Alto, CA (US); Marian Mankos, Palo Alto, CA (US); Liqun Han, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 302 days.

(21) Appl. No.: 12/204,841

(22) Filed: Sep. 5, 2008

Related U.S. Application Data

(60) Provisional application No. 60/970,569, filed on Sep. 7, 2007.

(51) Int. Cl.
*H01J 27/02* (2006.01)

(52) U.S. Cl. ............... 313/361.1; 313/425; 250/492.1; 250/310

(58) Field of Classification Search ............. 313/425, 313/361.1; 250/492.1, 301
See application file for complete search history.

(56) References Cited

U.S. PATENT DOCUMENTS 6,392,333 B1 * 5/2002 Veneklasen et al. ...... 313/361.1
2006/0231773 A1 * 10/2006 Katagiri et al. .......... 250/492.1

* cited by examiner

*Primary Examiner*—Mariceli Santiago
*Assistant Examiner*—Mary Ellen Bowman
(74) *Attorney, Agent, or Firm*—Luedeka, Neely & Graham, P.C.

(57) ABSTRACT

An electron gun of the type having an electron emitter for emitting electrons, including an electrostatic lens and a magnetic lens formed by pole pieces with a winding coil disposed between the magnetic pole pieces. The magnetic lens forms a rotationally symmetrical magnetic field in a gap formed by the pole pieces. The magnetic field forms the magnetic lens and focuses the electrons emitted from the emitter. A vacuum tube separates the electron gun from the magnetic lens. The electron gun is sealed in a vacuum by the vacuum tube and the magnetic lens is shielded in air.

5 Claims, 8 Drawing Sheets

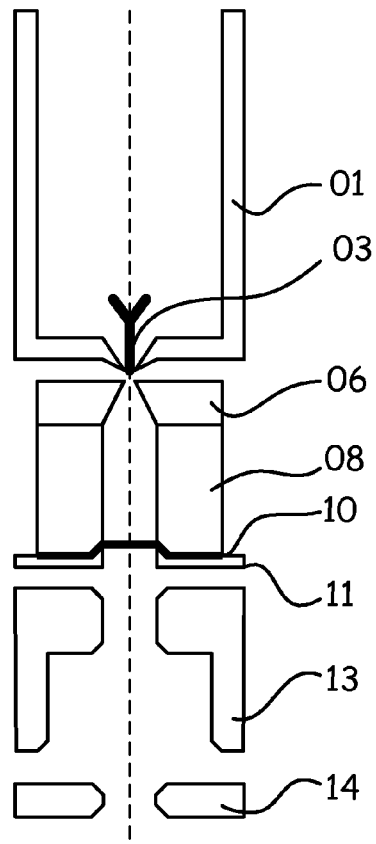
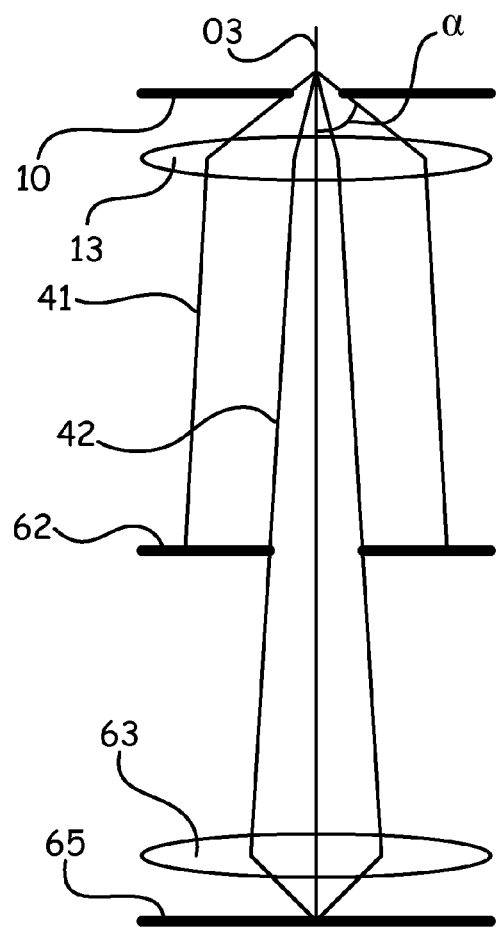
Fig. 1A
(Prior Art)
Fig. 1B
(Prior Art)

IMMERSION GUN EQUIPPED ELECTRON BEAM COLUMN

FIELD

The application claims all rights and priority on U.S. provisional patent application Ser. No. 60/970,569 filed Sep. 7, 2007. This invention relates to the field of integrated circuits. More particularly, this invention relates to inspection tools for integrated circuits.

BACKGROUND

A focused electron beam system (ebeam) is commonly used to create or examine the microstructure of articles. A common article of interest is a silicon substrate, such as is used in the fabrication of integrated circuits. The beam is formed with electrons that are emitted from an emitter in an electron gun, and acts as a fine probe when it interacts with the substrate for examining microstructures. The performance of the ebeam is generally characterized by the spot size at a given beam current.

As depicted in FIG. 1A, a commonly used electron gun for generating and controlling the electrons in an ebeam tool is an electrostatic gun consisting of a suppressor 01, an electron emitter 03, an extractor 06, a focusing lens electrode 13, and an anode 14. The electrons emitted from the tip of the emitter 03 are selected by a beam limiting aperture 10 for controlling the beam current to the electron optical column (as depicted in FIG. 1B), consisting of the electron gun lens 13, column aperture 62, objective lens 63 and the substrate under inspection 65. The extractor 06, the beam aperture 10, the aperture holder 11, and the sandwich electrode 08 between the extractor 06 and aperture 10 are applied with the same voltage (extractor voltage). The emitter 03 and suppressor 01 are biased with negative voltages depending on the desired beam energy for the ebeam. For example, if a beam energy of 12 keV is required, the emitter is biased at −12 kV. The anode 14 is commonly grounded. The size of the beam aperture 10 inside the extractor 06 is commonly fixed in order to provide the column with a constant raw beam current within the electron beam profile 41. The beam current defined by the beam aperture 10, i, is given by:

$$I = \pi J \alpha^2 \qquad (1),$$

in which j is a virtual source angular intensity of about one milliamperes per steradian, and the α shown in FIG. 1B is the ebeam angle defined at the virtual source plane. The final beam current delivered to the substrate 65 within the electron beam profile 42 is selected by the size of the column aperture 62 and the voltage applied on the focusing lens electrode 13. The electrons within the beam profile 42 are focused by the objective lens 63, and form a small ebeam spot on the surface of the substrate 65.

The performance of an electron gun lens is commonly characterized by a spherical aberration coefficient ($C_{gs}$) and a chromatic aberration coefficient ($C_{gc}$), because the $C_{gs}$ and $C_{gc}$ directly reflect the spherical aberration blur $d_{gs}$ ($d_{gs} \sim C_{gs} \alpha^3$) and chromatic aberration blur $d_{gc}$ ($d_{gc} \sim C_{gc} \alpha$). The $C_{gs}$ and $C_{gc}$ are strongly related to the working distance of the gun lens. The working distance is defined as the distance between the virtual source plane and the principal plane of the gun lens. The shorter the working distance, the smaller the values of $C_{gs}$ and $C_{gc}$ will be. Typically, the $C_{gs}$ and $C_{gc}$ are given to be a few hundreds of millimeters and a few tens of millimeters, respectively. The gun lens aberration blurs are magnified via the optical magnification M of the column, and finally affect the resolution of an ebeam probe at the substrate.

However, there are some disadvantages of an electrostatic gun. For example, the large $C_{gs}$ and $C_{gc}$ due to a long working distance in an electrostatic gun heavily affect the resolution of an ebeam probe at the substrate, because the gun aberration coefficients $C_{gs}$ and $C_{gc}$ are magnified via the column optical magnification M. The total spherical aberration coefficient ($C_{ts}$) and total chromatic aberration coefficient ($C_{ts}$) at the substrate end in the column of FIG. 1B are calculated by:

$$C_{ts} = C_{os} + M^4 C_{gs} \left(\frac{V_{LE}}{V_{ext}}\right)^{3/2}, \text{ and} \qquad (2)$$

$$C_{tc} = C_{oc} + M^2 C_{gc} \left(\frac{V_{LE}}{V_{ext}}\right)^{3/2}, \qquad (3)$$

in which $C_{os}$ and $C_{oc}$ are the spherical and chromatic aberration coefficients of the objective lens 63 respectively, $V_{le}$ is the landing energy voltage of the ebeam at the substrate, and $V_{ext}$ is the voltage on the extractor 06. It is seen from equations (2) and (3) that the total $C_{ts}$ and $C_{tc}$ increase sharply with the increase of the column optical magnification M. In practice, a relative large M is commonly required in order to allow the optics to get a large depth of focus. Accordingly, the gun $C_{gs}$ and $C_{gc}$ play a critical role in affecting the resolution of an ebeam instrument.

Further, the Coulomb interactions between the electrons in the upper column (above the column aperture 62) strongly affect the resolution of the ebeam in low beam current applications. In a typical application of the electron beam inspection of a substrate, the beam currents to the substrate are divided into a number of groups. The lowest beam current group (less than about one nanoampere) is used to review an inspected substrate. The low beam current group (about five nanoamperes to about seventy-five nanoamperes) is used to inspect the substrate with a high resolution (or a high defect capture sensitivity). The highest beam current group (about five hundred nanoamperes to about one thousand nanoamperes) is used to inspect the substrate with high throughput (high scan speed of about 800 megahertz to about 1600 megahertz). In these applications, the size of the beam aperture 10 should be large enough to allow at least 1000 nanoamperes of beam current to the column. On the other hand, the size of the column aperture 62 should be small enough to select the low beam currents (<75 nanoamperes) to the substrate. This causes a large quantity of electrons to be stopped in the space between the beam aperture 10 and the column aperture. The Coulomb interactions between these electrons cause severe blur at the substrate, and prohibit the low beam current groups from achieving higher resolutions.

The advantage of the electrostatic gun depicted in FIG. 1A is that the virtual source angular intensity j in equation (1) keeps unchanged when the voltage on the focusing lens 13 is varied to adjust the column for a higher resolution and for a desired beam current to the substrate, because the lens electrical field is well-shielded by the electrode of the beam aperture holder 11.

What is needed, therefore, is a system that overcomes problems such as those described above, at least in part.

SUMMARY

The above and other needs are met by an improvement to an electron gun of the type having an electron emitter for emitting electrons, where the improved electron gun includes a magnetic lens formed by pole pieces with a winding coil disposed between the magnetic pole pieces. The magnetic lens forms a rotationally symmetrical magnetic field in a gap formed in the pole pieces. The magnetic field forms the magnetic lens and focuses the electrons emitted from the emitter. A vacuum tube separates the electron gun from the magnetic lens. The electron gun is sealed in a vacuum by the vacuum tube and the magnetic lens is shielded in air.

In this manner, having both electrostatic and magnetic fields in the electron gun provides three specific electron gun modes for an ebeam instrument, which are (1) the e-gun mode, (2) the mag-gun mode, and (3) the mixed gun mode. The mixed gun can be made from an electrostatic gun design without losing or changing any functionality in the existing electron gun. The mixed gun uses only one constant beam limiting aperture size, to select low raw beam current for the e-gun mode and high raw beam current for the mag-gun mode. The beam aperture is sandwiched in between the e-gun lens and magnetic gun lens, based on the principle that the working distances in the e-gun lens and mag-gun lens are different.

In one mode of operation the electron gun functions as an electrostatic gun in e-gun mode when a current through the winding coil is set to zero and the electron beam is controlled by an electron gun lens. In another mode of operation the electron gun functions as a magnetic immersion gun in mag-gun mode when a voltage on a focusing lens electrode is one of zero and a same voltage as applied to an anode, the magnetic field is formed in the gap of the pole pieces, and the magnetic field controls the electron beam.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1A depicts a prior art electrostatic gun.

FIG. 1B depicts prior art gun optics in a two-lens electron optical column.

DETAILED DESCRIPTION

The embodiments of the present invention raise both the resolution and the throughput of an electron beam instrument, such as an electron beam inspection system for substrates. The resolution and throughput of an ebeam instrument is best characterized by the spot size at sample (the smaller the spot size, the better the resolution) and the current delivered to the sample (the higher the beam current, the higher the throughput).

Figure 2A:
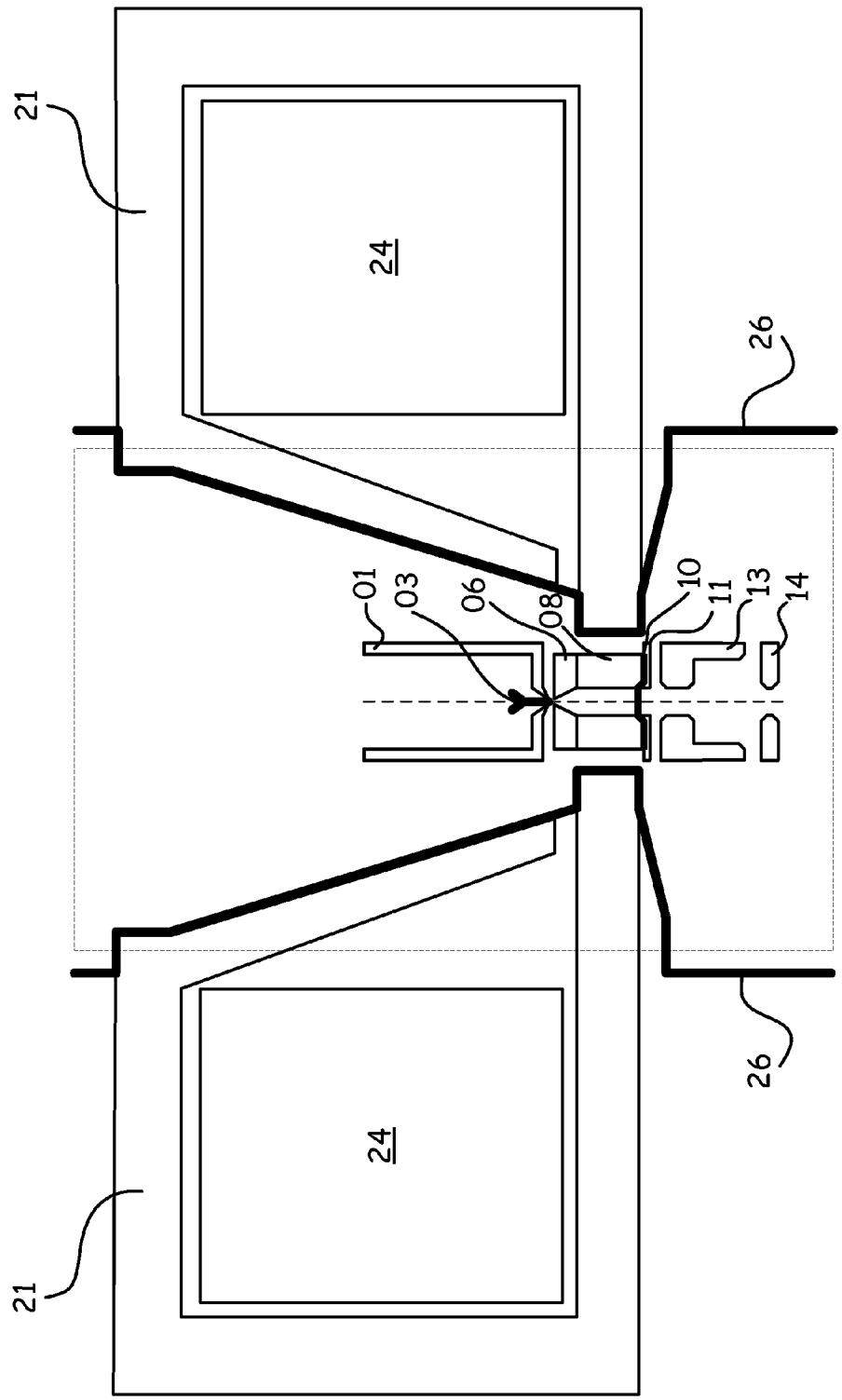
FIG. 2A depicts a first view of an electrostatic-magnetic mixed electron gun according to an embodiment of the present invention.
Figure 2B:
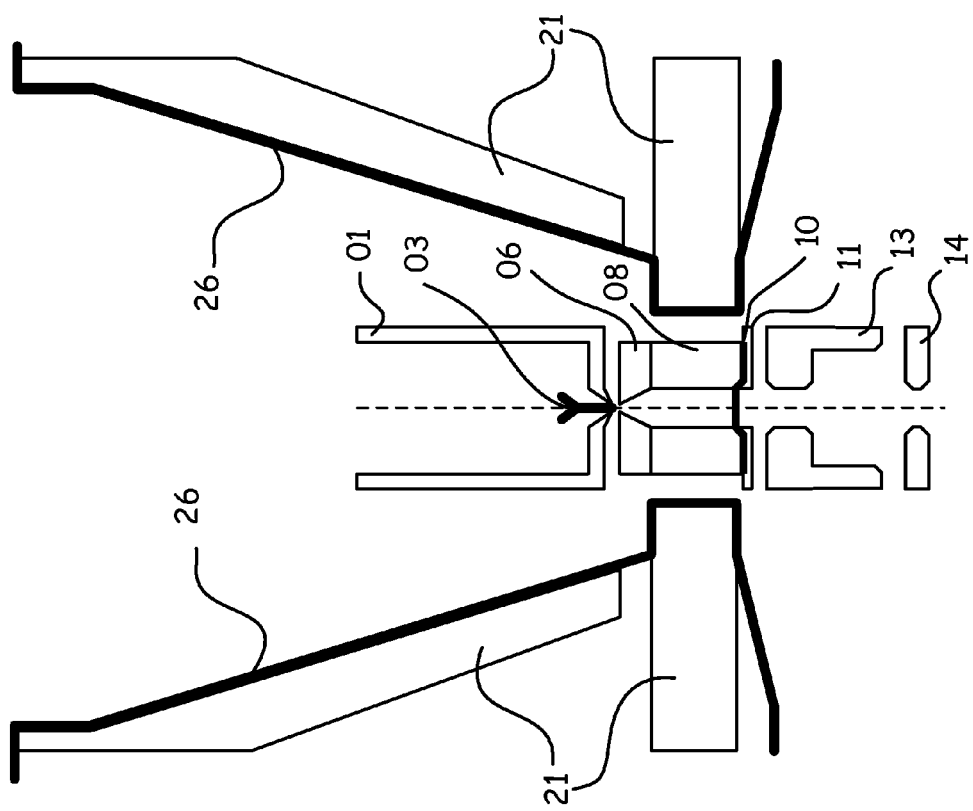
FIG. 2B depicts a second view of an electrostatic-magnetic mixed electron gun according to an embodiment of the present invention.
Figure 2C:
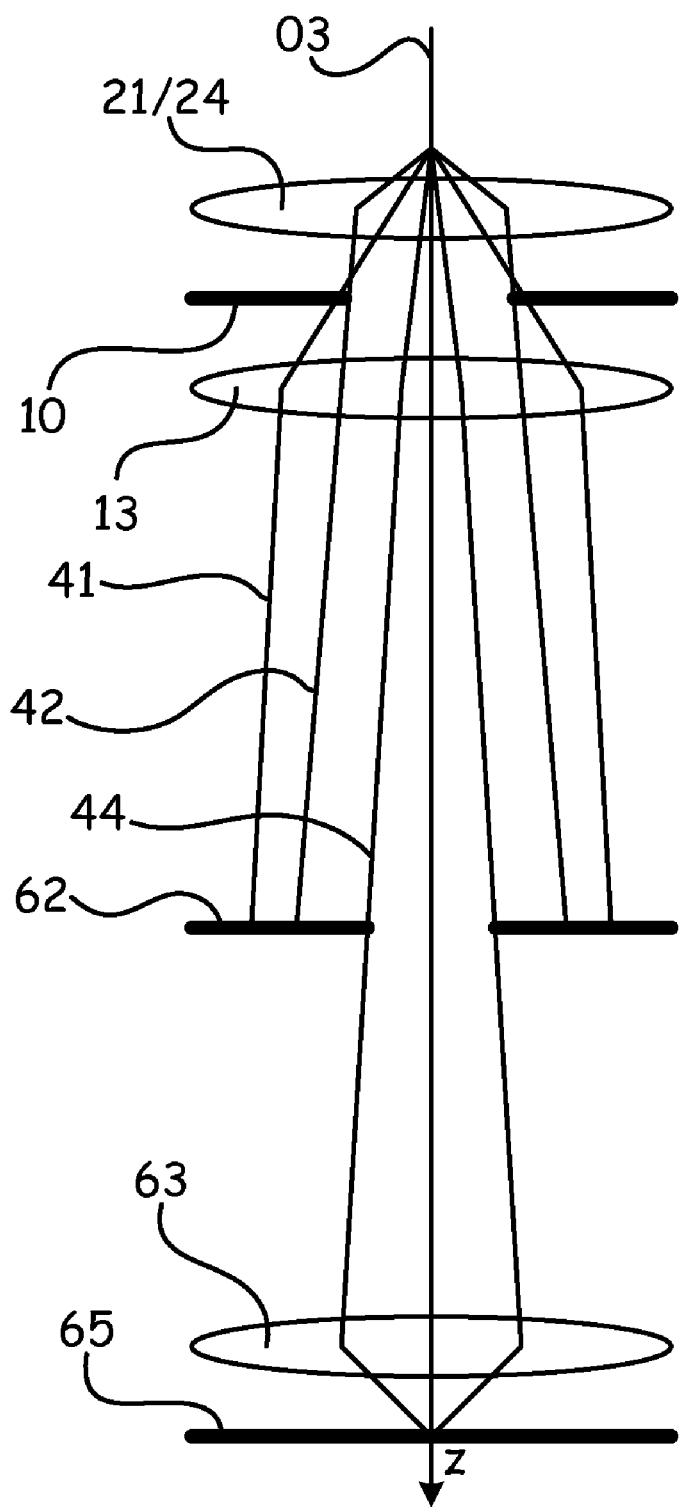
FIG. 2C depicts the gun optics in the electron optical column according to an embodiment of the present invention.

FIG. 2 depicts one embodiment according to the present invention of an electrostatic-magnetic mixed electron gun. It is built based on the configuration of the electrostatic gun in FIG. 1A without losing any functionality of the existing electron gun. The mixed electron gun consists of the existing electrostatic gun in FIG. 1A and a magnetic lens formed by a magnetic pole piece circuit 21/22 and a winding coil 24 hold between the pole piece structure 21/22. A rotationally symmetric magnetic field is generated in the gap of the pole pieces. The magnetic field is used to form the magnetic lens 21/24 in FIG. 2B to focus the electrons emitted from the tip of the emitter 03.

A vacuum tube 26, such as formed of titanium, is used to separate the electrostatic gun from the magnetic lens. The electrostatic gun is sealed in the vacuum by the vacuum tube as usual and the magnetic lens 21 and 24 is shielded in air by the vacuum tube to prevent the emitter tip from being poisoned. The pole piece configuration for the magnetic circuit is designed as a fat, short shape to improve vacuum pumping in the electron emission region, in which a high vacuum condition (in the range of about one nanotorr) is commonly required. The minimum gap distance between the vacuum tube and electrostatic gun part is larger than about three millimeters so at to avoid arcing (a possible voltage difference is about six kilovolts for a 12 keV beam energy application).

The mixed gun becomes a pure electrostatic gun as depicted in FIG. 1A (the e-gun mode) when the current through the coil 24 is set to zero (the magnetic lens 21/24 in FIG. 2B is switched off). The electrode 13 in FIG. 2A is used in place of the focusing lens 13 as depicted in FIG. 2B, and the electron beam 41/44 in FIG. 2B is under the control of the lens 13.

The mixed gun becomes a pure magnetic immersion gun (the mag-gun mode) when the voltage on the focusing electrode 13 is either zero or the same voltage as the anode 14 (the electrostatic gun lens 13 in FIG. 2B is gone). The magnetic lens 21/24 in FIG. 2B is formed in the gap of the pole pieces 21, and is used to focus and otherwise control the electron beam 42 as depicted in FIG. 2B.

One beam limiting aperture 10 serves both of the gun modes (the e-gun mode and mag-gun mode) for selecting two groups of raw beam currents that are delivered to the electron optical column. In the e-gun mode, the beam aperture 10 is placed above the e-gun lens 13, and the electrons in the ebeam profile 41 are selected by the beam aperture 10 before being focused by the lens 13. In the mag-gun mode, the beam aperture 10 is located below the b-gun lens 21/24, and the electrons 42 from the tip are focused by the lens 21/24 before being selected by the beam aperture 10.

This unique beam aperture 10 setting technique enables a high beam current in the mag-gun mode and a low beam current in the e-gun mode. In a preferred embodiment for substrate inspection, the size of the beam aperture 10 is about two hundred microns, through which the beam current of 250 nanoamperes, or 1000 nanoamperes, at an angular intensity of about one milliampere per steradian is allowed to pass through the beam aperture 10 when the e-gun mode or mag-gun mode is on, respectively.

The e-gun mode is used for high resolution applications with low beam currents, in which the final beam current down to the substrate is in a range of 0.3125 nanoamperes in a preferred embodiment for substrate inspection. Using the e-gun mode, the beam current between the beam aperture 10 and the column aperture 62 is limited to be less than or equal to about 250 nanoamperes, such that the electron interactions in the upper column are greatly reduced, compared to when a 1000 nanoampere raw beam current exists in the upper column.

The mag-gun mode is used for high throughput applications with high beam currents, in which the final beam current down to the substrate can be up to about a thousand nanoamperes for a substrate inspection rate in the gigapixels per second range. In high current applications, the gun lens aberrations (particularly, the gun lens spherical aberration) play a dominant role in affecting the ebeam resolution at the substrate. A magnetic immersion gun is well-known to be able to provide the superior performance with considerably smaller lens aberrations, as exemplified in Table 1.

TABLE 1

Gun lens performance comparison between the mag-gun mode and e-gun modes.

| Extractor voltage $V_{ext}$ = 6470V, & Beam energy BE = 12keV | Spherical aberration coefficient $C_{gs}$(mm) | Chromatic aberration coefficient $C_{gc}$(mm) |
| --- | --- | --- |
| The Mag-Gun mode in FIG.2 (a) | 5.7 | 3.6 |
| The E-Gun mode in FIG.2 (a) | 298 | 39 |

Figure 3:
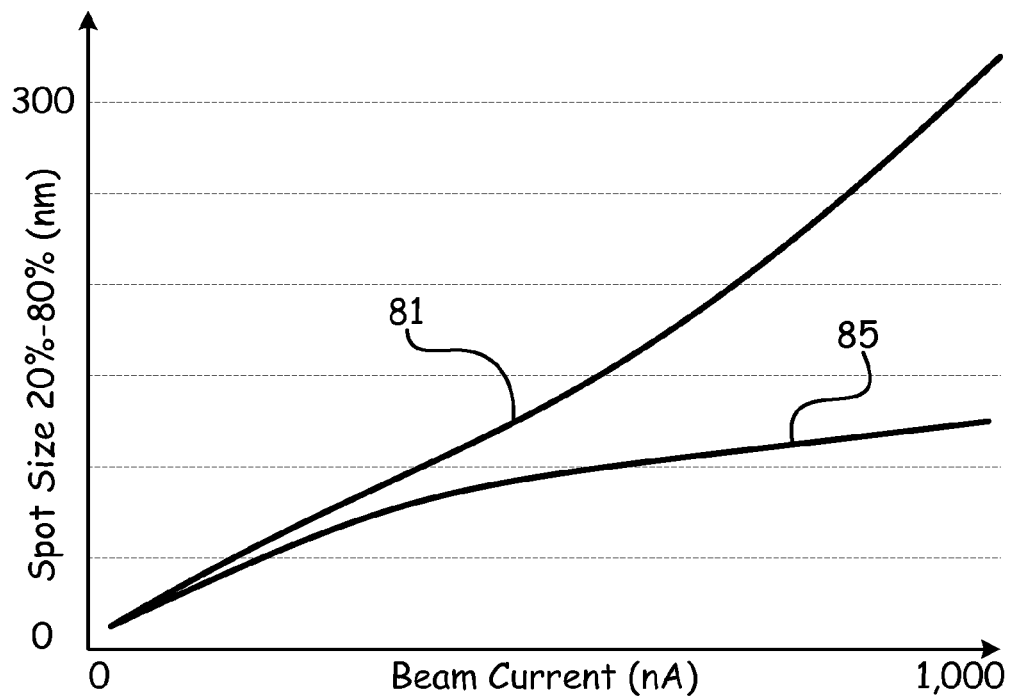
FIG. 3 is a graph of optical performance for the e-gun mode and the b-gun mode in an electrostatic-magnetic mixed electron gun according to an embodiment of the present invention, at a beam energy of 12 keV and a landing energy of 1 keV.

The superior mag-gun performance shown in Table 1 is depicted in FIG. 3, in which the ebeam spot size at the substrate is related to the beam current delivered from the electron emitter 03 to the substrate 65. The spot size is given by simulations using a commercial available software package. The embodiment depicted in FIG. 2B is an electron optical column for substrate inspection with a 12 keV beam energy and 1 keV landing energy. The Coulomb interactions in the ebeam column and all of the lens aberrations from the gun and objective lens 63 are taken into account in the simulations.

To compare the upper limit of performance, the beam current is assumed to be identical from the emitter to the substrate (this assumption is not realistic, but useful for exploring the upper limit of performance without losing generality). The beam current changes with the ebeam angle α at the virtual source in equation (1), under a constant angular intensity of about one milliampere per steradian. Compared to the e-gun mode 81, the spot size in the mag-gun mode 85 is greatly reduced across the full beam current, as can be seen in Table 2 below as well. The higher the beam current, the larger the difference between the spot sizes in the two gun modes will be, although the difference in low beam currents (less than about 125 nanoamperes) is limited.

TABLE 2

Optical performance in b-gun mode versus e-gun mode

| Beam current to wafer (nA) | 25 | 75 | 125 | 250 | 500 | 750 | 1000 |
| --- | --- | --- | --- | --- | --- | --- | --- |
| Spot size ratio of Mag-Gun mode to E-Gun mode | 0.82 | 0.86 | 0.87 | 0.79 | 0.58 | 0.44 | 0.37 |

In practice, the spot sizes in low beam currents can not be achieved as well as indicated in FIG. 3 because the column aperture 62 is used to select the low beam currents, while the raw beam current above the column aperture is maintained at about 1000 nanoamperes, and because the electron interactions between the large quantity of electrons above the column aperture degrades the ebeam resolution at the substrate. However, this weakness can be overcome to a great extent by the electrostatic-magnetic mixed electron gun of FIG. 2.

As stated previously, the raw beam current is divided into two groups by using one beam aperture 10 of about two hundred microns in size in a preferred embodiment for substrate inspection. For the low raw beam current of 250 nanoamperes, the e-gun mode is employed (the mag-gun mode is off) and the spot size at the substrate can be close to the ideal performance depicted in FIG. 3, because the electron interactions between the residual electrons above the column aperture are considerably limited. In the high raw beam current of 1000 nanoamperes, the mag-gun mode is used (the e-gun mode is off) and the spot size can be close to the ideal performance depicted in FIG. 3, because the blur due to the electron interactions between the residual electrons above the column aperture is less weighted than the lens aberrations (particularly, the spherical aberration).

The mag-gun mode in this case presents a unique advantage to achieve high resolution down to the substrate with the high beam currents. This advantage is characterized in FIG. 4, in which the spot size at the substrate is again related to the beam current. In the simulations for FIG. 4, the size of the beam aperture 10 is fixed at about two hundred microns, and the size of the column aperture 62 is optimized for two kinds of minimal spot sizes.

Figure 4:
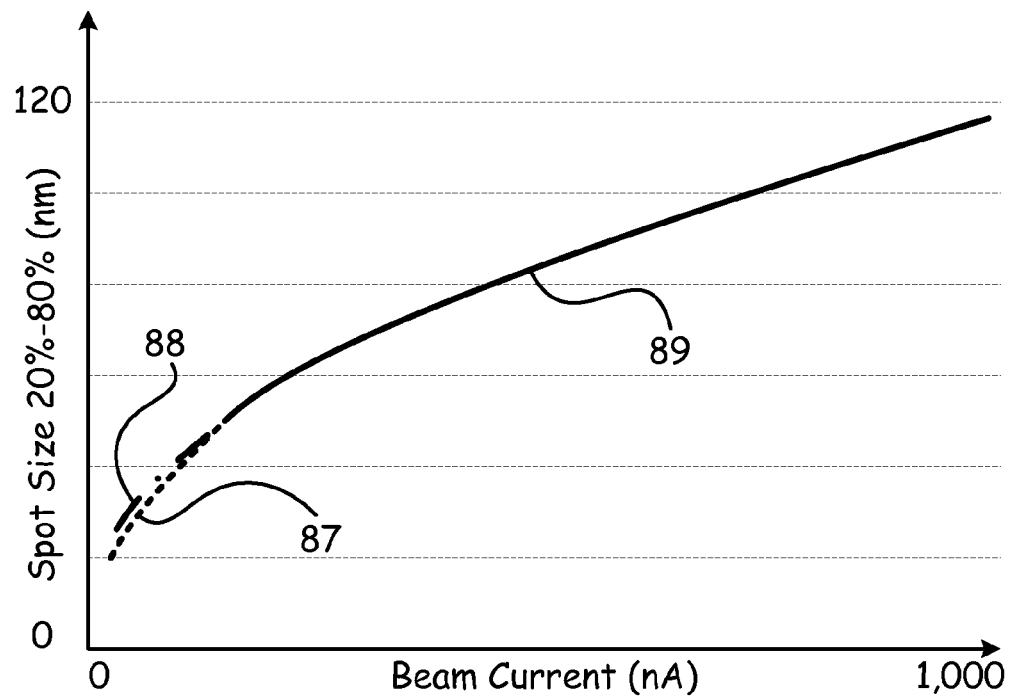
FIG. 4 depicts optical performance with the electrostatic-magnetic mixed gun according to an embodiment of the present invention, when running in alternate modes.

The first spot size is the minimal spot size with a depth of focus constraint, as shown in plots 88 and 89 of FIG. 4. The depth of focus requirement is as important as the spot size in applications such as of examining or creating a high aspect ratio microstructure on the substrate using focused electron beams. In FIG. 4, plots 88 and 89 are the minimal spot sizes with the constraint of a depth of focus greater than or equal to plus one micron and minus one micron, when the e-gun and b-gun are on, respectively.

The second spot size is the minimal spot size without a depth of focus constraint. It is used in low aspect ratio microstructure examinations or measurements. The minimal spot size is acquired by optimizing the column aperture 62 solely, and it can be much smaller than a spot size with a depth of focus constraint, as can be seen in plot 87 of FIG. 4.

In a prior art magnetic immersion gun, the raw beam current passing through the beam limiting aperture varies with the flux density of the magnetic lens field, because the beam aperture 10 is completely immersed in the magnetic field. The magnetic lens field is varied quite often in practice, because of the need to adjust the column optical magnification for the best image resolution, or for a desired beam current through the column aperture. The variation of the raw beam current is not expected in practice because it causes an uncertain virtual source angular intensity, and the difficulties to characterize the optical performance of an electron beam column.

Figure 5A:
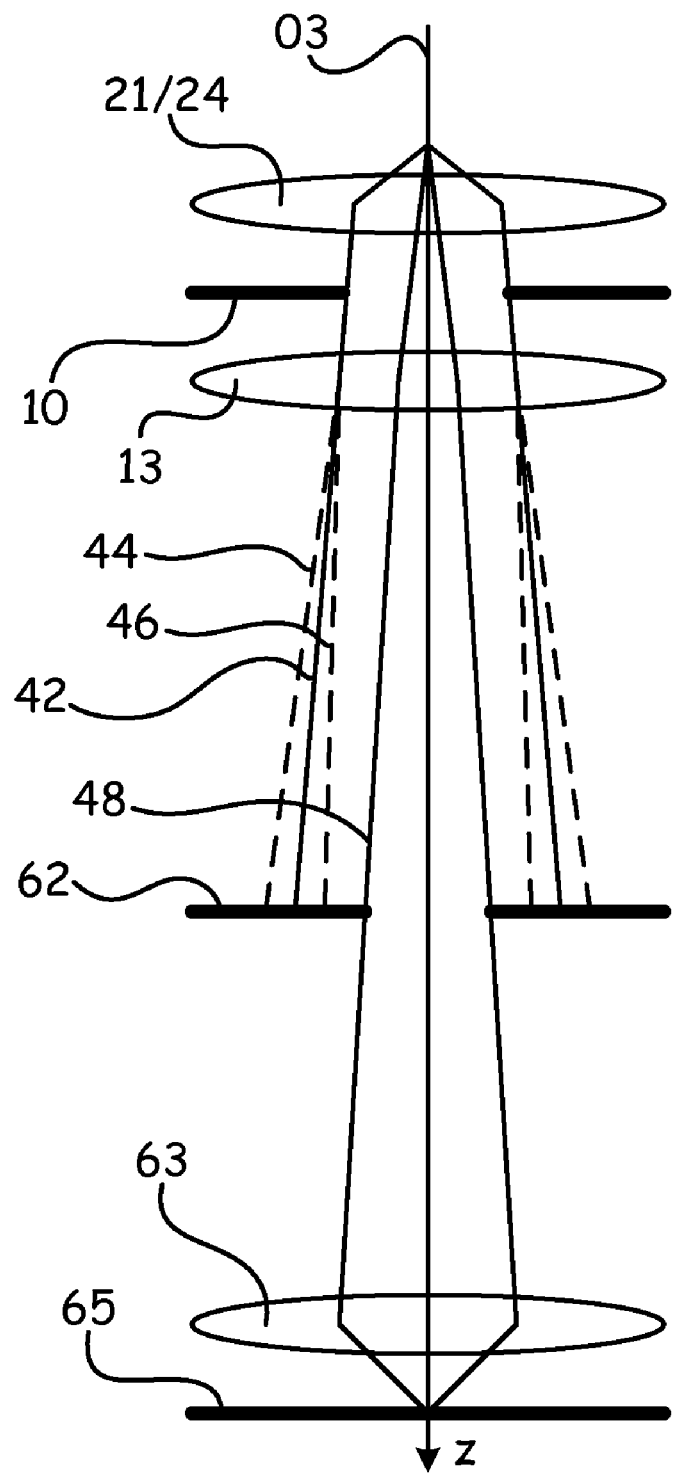
FIG. 5A depicts aspects of an e-lens-auxiliary b-gun mode according to an embodiment of the present invention, including optics of using the b-gun as the column source with an e-lens fine-tuning for the column optical magnification and beam current.
Figure 5B:
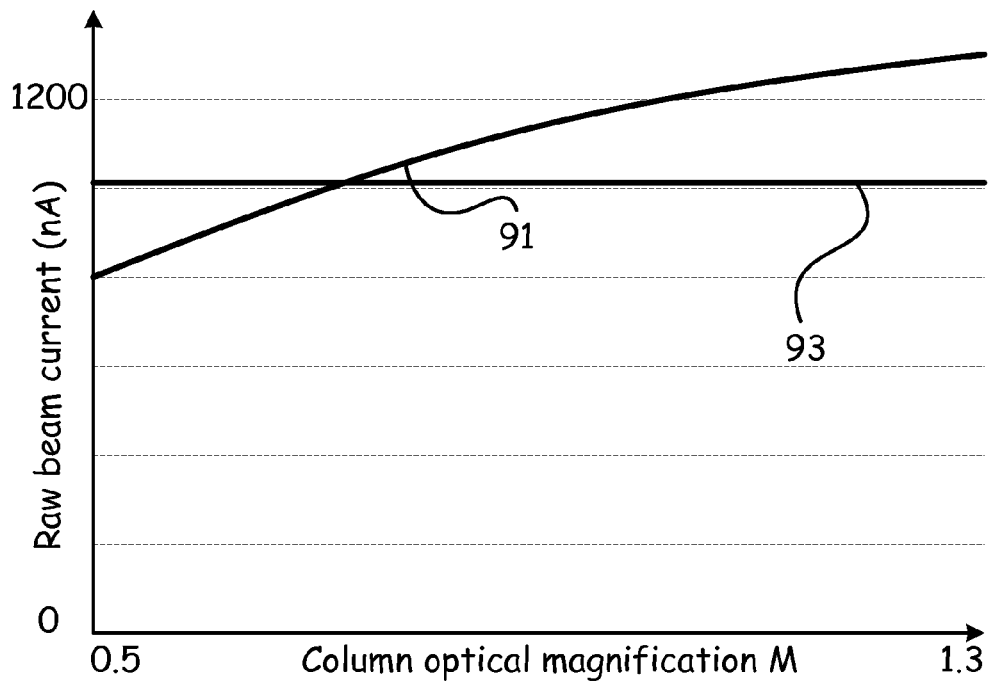
FIG. 5B depicts aspects of an e-lens-auxiliary b-gun mode according to an embodiment of the present invention, including an example of using an auxiliary e-lens fine-tuning to maintain a constant raw beam current.

This problem is also overcome by the electrostatic-magnetic mixed gun according to the present invention. This unique advantage is exhibited in FIG. 5, in which the mag-gun mode 03, 21/24 as depicted in FIG. 5A is used for high beam current applications. A 200 micron beam aperture 10 is used for a 1000 nanoampere raw beam current 42 when the magnetic lens excitation is selected for an optical magnification of 0.948 in a preferred embodiment for substrate inspection.

The e-lens 13 is used as an auxiliary lens to either focus 44 or defocus 46 the e-beam for selecting the best optical magnification and the desired beam current 48, after the magnetic lens excitation is fixed for a preferred magnification (0.9, for instance). It is found that the raw beam current increases significantly with the magnification if the magnetic lens excitation is varied, as depicted in plot 91 of FIG. 5B. However, the raw beam current is maintained substantially unchanged at about 1000 nanoamperes, as depicted in plot 93, if the electrostatic lens 13 is used to adjust the column magnification while the magnetic lens excitation is kept unchanged for M=0.9.

Figure 5C:
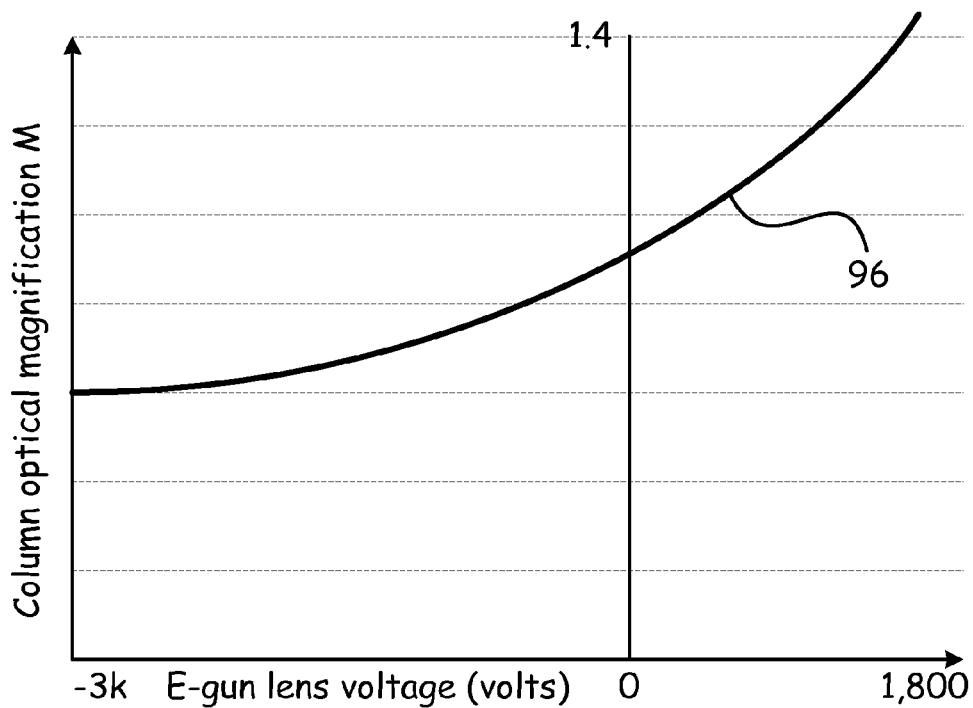
FIG. 5C depicts aspects of an e-lens-auxiliary b-gun mode according to an embodiment of the present invention, including an example of column optical magnification versus e-gun lens voltage in an e-lens-auxiliary b-gun mode, where the e-gun lens voltage is an absolute voltage with respect to the ground, and the beam energy is 12 keV.

The electrostatic lens in this application is only an auxiliary lens, for fine-turning, with a slight change of the voltage on the lens electrode (plot 96 in FIG. 5C). More importantly in practice, the fine-turning e-lens is found to be able to function as either a focusing lens 44 or a defocusing lens 46, as can be seen from plot 96 in FIG. 5C, where the focusing/defocusing sensitivity is relatively high.

The embodiments of the present invention provide numerous benefits. For example, the unique beam limiting aperture 10 setting technique allows controlling two raw beam currents with one fixed beam aperture 10 size when the mixed electron gun alternately runs in e-gun mode or mag-gun mode. This aspect largely removes the interactions between the residual electrons above the column aperture, and greatly improves the resolution in low beam current applications.

In addition, the weakness of uncertain angular intensity in commonly used magnetic immersion guns is removed in the scheme of an e-lens-auxiliary mag-gun mode, in which the e-lens is used to fine-tune the optics in order to get the best image resolution with the desired beam currents, while the mag-gun mode is employed for the high throughput applications with high beam currents. In the mag-gun mode, the auxiliary e-lens can be used either as a focusing lens or a defocusing lens with high sensitivity. This unique advantage allows the magnetic lens excitation to be fixed, while gaining the flexibility to optimize the column optics with a slight adjustment of the e-lens voltage.

Thus, having both electrostatic and magnetic fields provides three specific electron gun modes for an ebeam instrument, which are (1) the e-gun mode, (2) the mag-gun mode, and (3) the mixed gun mode. The mixed gun can be made from an electrostatic gun design without losing or changing any functionality in the existing electron gun. The mixed gun uses only one constant beam limiting aperture size, to select low raw beam current for the e-gun mode and high raw beam current for the b-gun mode. The beam aperture is sandwiched in between the e-gun lens and mag-gun, lens based on the principle that the working distances in the e-gun lens and mag-gun lens are different.

In the e-gun mode for low beam current applications, the number of residual electrons above the column aperture is small because the raw beam current is low, such that the electron interactions in the upper column are greatly reduced, and the resolution for low beam current applications is largely improved. In the mag-gun mode for high beam current applications, the gun lens spherical aberration and chromatic aberration are greatly cut down, such that the resolution for high beam current applications is greatly raised as well.

In the e-gun mode, the gun lens electrical field is well shielded by the beam aperture and the aperture holder, such that the gun angular intensity is not affected by the variation of the gun lens voltage caused by adjusting the column optics for resolution and beam currents. In the e-lens-auxiliary mag-gun mode, a slight voltage variation on the e-gun lens can be used to fine-tune the column optics for the best resolution and the desired beam currents, removing any uncertainty in the angular intensity from the variation of the magnetic excitation.

In the e-lens-auxiliary b-gun mode, the e-lens functions not only as a focusing lens, but also as a defocusing lens with high sensitivity, thereby offering the unique advantage of fixing the magnetic lens excitation and gaining the flexibility of optimizing the column optics by a slight adjustment of the e-lens voltage. The magnetic lens (pole pieces and coil) is sealed in air via a vacuum tube, such that the electron emitter is in a high vacuum and doesn't get poisoned. The magnetic lens pole piece circuit is designed as a fat, short structure, such that a large space is created in the electron emission region for high vacuum pumping.

Figure 6:
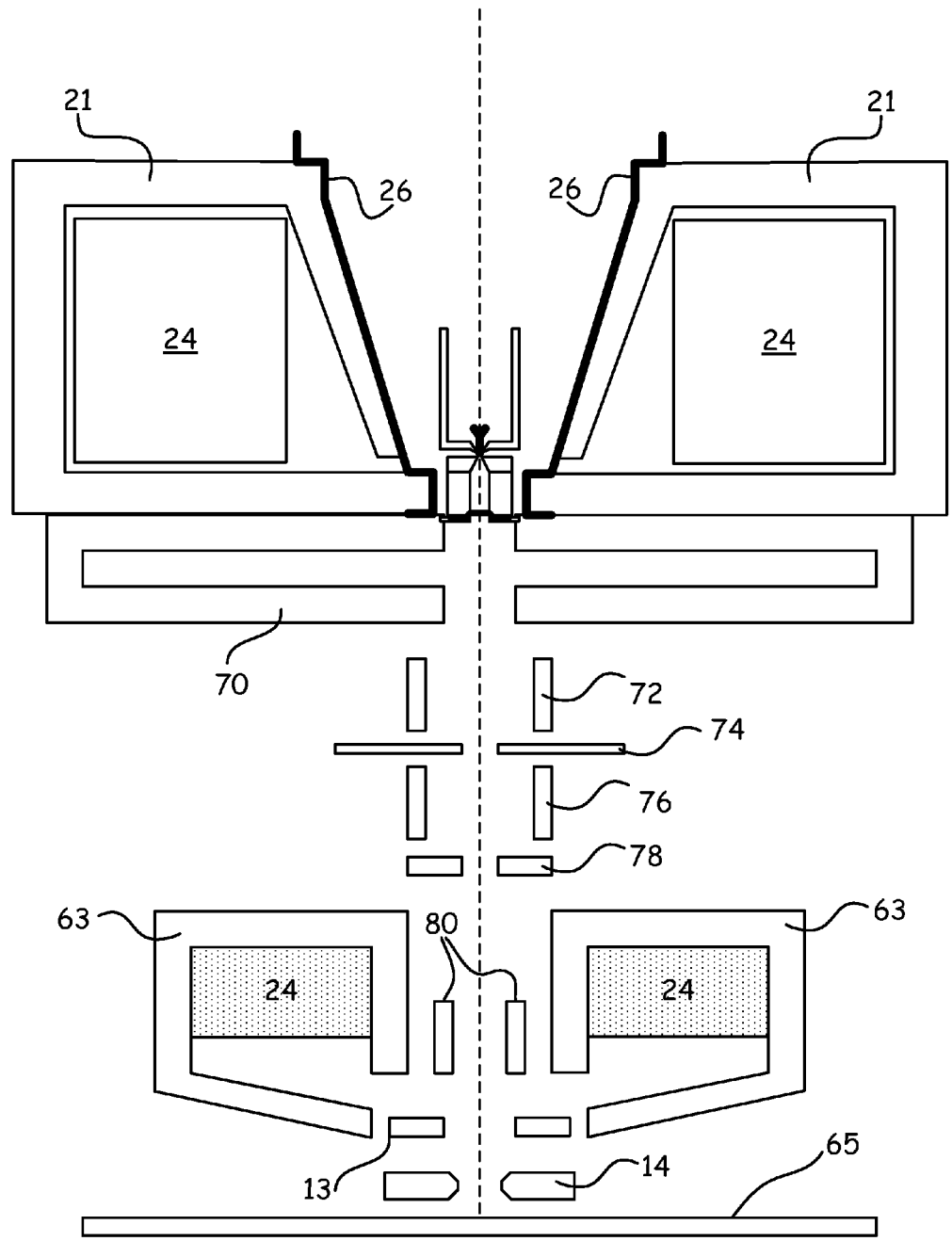
FIG. 6 depicts an inspection system according to an additional embodiment of the present invention.

A mixed gun is depicted in FIG. 6. The mixed gun is mounted on a column that produces a focused beam of electrons at the substrate 65, scans the beam across the surface of the substrate 65, collects and detects secondary and backscattered electrons, and maintains charge control on the substrate 65 surface. Apart from the advantages of higher resolution and beam current, the mixed gun also has the benefits of better high voltage reliability without the electrostatic lens and better shielding from electromagnetic interference due to the surrounding pole-pieces. This embodiment depicts the gate valve 70, alignment elements 72, aperture 74, deflectors 76, and detectors 78.

The electrons emitted from the source are focused by the gun lens and deflected by a multiple stage deflection system, including two quadrupoles, one octupole, and a Wien filter 80, which also separates the secondary electrons from the primary beam. The beam is then refocused by a compound objective lens having a magnetic lens 63 and a retarding electrostatic lens 13. The field from the magnetic lens 63 also serves to trap secondary electrons from the substrate 65 and guide them up the lens bore to the detector 78. The electrostatic retarding lens 13 works in combination with the magnetic lens 63 to bring the electron beam to a focus at the substrate 65 plane. It also serves to reduce the electron energy from about ten thousand electron volts to the beam landing energy, which is typically about one hundred electron volts to about three thousand electron volts.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electrostatic-magnetic mixed electron gun, comprising:
   an electrostatic gun comprising,
      a suppressor,
      an electron emitter for emitting an electron beam,
      an extractor,
      a beam limiting aperture,
      a focusing lens electrode,
      an electron gun lens,
      a column aperture,
      an objective lens, and
      an anode,
   a magnetic lens formed by pole pieces with a winding coil disposed between the magnetic pole pieces, the magnetic lens forming a rotationally symmetrical magnetic field in a gap formed in the pole pieces, where the magnetic field forms the magnetic lens and focuses the electron beam emitted from the emitter, and
   a vacuum tube to separate the electrostatic gun from the magnetic lens, where the electrostatic gun is sealed in a vacuum by the vacuum tube and the magnetic lens is shielded in air.

2. The electrostatic-magnetic mixed electron gun of claim 1, wherein the electrostatic-magnetic mixed gun functions as an electrostatic gun in e-gun mode when a current through the winding coil is set to zero and the electron beam is controlled by the electron gun lens.

3. The electrostatic-magnetic mixed electron gun of claim 1, wherein the electrostatic-magnetic mixed gun functions as a magnetic immersion gun in b-gun mode when a voltage on the focusing lens electrode is one of zero and a same voltage as applied to the anode, the magnetic field is formed in the gap of the pole piece, and the magnetic field controls the electron beam.

4. The electrostatic-magnetic mixed electron gun of claim 1, further comprising a magnetic objective lens formed by a second pole piece with a second winding coil disposed inside the second pole piece, the magnetic objective lens forming a rotationally symmetrical magnetic field in a gap formed in the second pole piece, where the magnetic field forms the magnetic objective lens.

5. The electrostatic-magnetic mixed electron gun of claim 1, further comprising a magnetic objective lens formed by a second pole piece with a second winding coil disposed inside the second pole piece, the magnetic objective lens forming a rotationally symmetrical magnetic field in a gap formed in the second pole piece, where the magnetic field forms the magnetic objective lens.

* * * * *